(12) United States Patent
Lindau

(10) Patent No.: US 6,909,096 B1
(45) Date of Patent: Jun. 21, 2005

(54) QUANTUM WELL BASED TWO-DIMENSIONAL DETECTOR FOR IR RADIATION AND CAMERA SYSTEM WITH SUCH A DETECTOR

(75) Inventor: Sten Lindau, Täby (SE)

(73) Assignee: Saabtech Electronics AB, Järfälla (SE)

( * ) Notice: Subject to any disclaimer, the term of this patent is extended or adjusted under 35 U.S.C. 154(b) by 0 days.

(21) Appl. No.: 09/914,955
(22) PCT Filed: Mar. 9, 2000
(86) PCT No.: PCT/SE00/00470
§ 371 (c)(1),
(2), (4) Date: Nov. 13, 2001
(87) PCT Pub. No.: WO00/55922
PCT Pub. Date: Sep. 21, 2000

(30) Foreign Application Priority Data

Mar. 12, 1999 (SE) ............................................. 9900885

(51) Int. Cl.[7] ................................................. G01J 5/20
(52) U.S. Cl. ....................................................... 250/353
(58) Field of Search ........................................ 250/353

(56) References Cited

U.S. PATENT DOCUMENTS

| 5,056,889 | A | * | 10/1991 | Morgan | ....................... | 359/572 |
| 5,075,749 | A | | 12/1991 | Chi et al. | | |
| 5,373,182 | A | * | 12/1994 | Norton | ....................... | 257/440 |
| 5,485,015 | A | | 1/1996 | Choi | | |
| 5,506,419 | A | | 4/1996 | Levine et al. | | |
| 5,539,206 | A | | 7/1996 | Schimert | | |

FOREIGN PATENT DOCUMENTS

| EP | 0508970 | 10/1992 |
| EP | 0617471 | 6/1998 |

OTHER PUBLICATIONS

Lee et al., "Quantum well infrared photodetectors with bi–periodic grating couplers", Appl. Phys. Lett., vol. 61, No. 20 (Nov. 16, 1992), pp. 2437–2439.*

K.L. Tsai et al., Two–Dimensional Bi–Periodic Grating Coupled One– and Two–Color Quantum Well Infrared Photodetectors, IEEE Electron Device Letters, vol. 16, No. 2, Feb. 1995 p. 49–51.

* cited by examiner

Primary Examiner—Constantine Hannaher
Assistant Examiner—Shun Lee
(74) Attorney, Agent, or Firm—Venable LLP; Eric J. Franklin

(57) ABSTRACT

A quantum well based two-dimensional detector (1) for detecting infrared radiation which receives infrared radiation falling upon its detector surface (1a) at various angles of incidence. The detector comprises a grating arrangement for diffraction of the incident radiation. The arrangement is selected with a grating interval which varies or changes from the central part of the detector. out towards the outer parts of the detector. The variation or change in the grating interval is arranged to retain in the detection diffracted rays of the orders 1 and −1 as active components over the whole detector surface by changing the angle values of the diffracted rays depending upon the angles of incidence of the radiation falling on various parts of the detector surface.

13 Claims, 3 Drawing Sheets

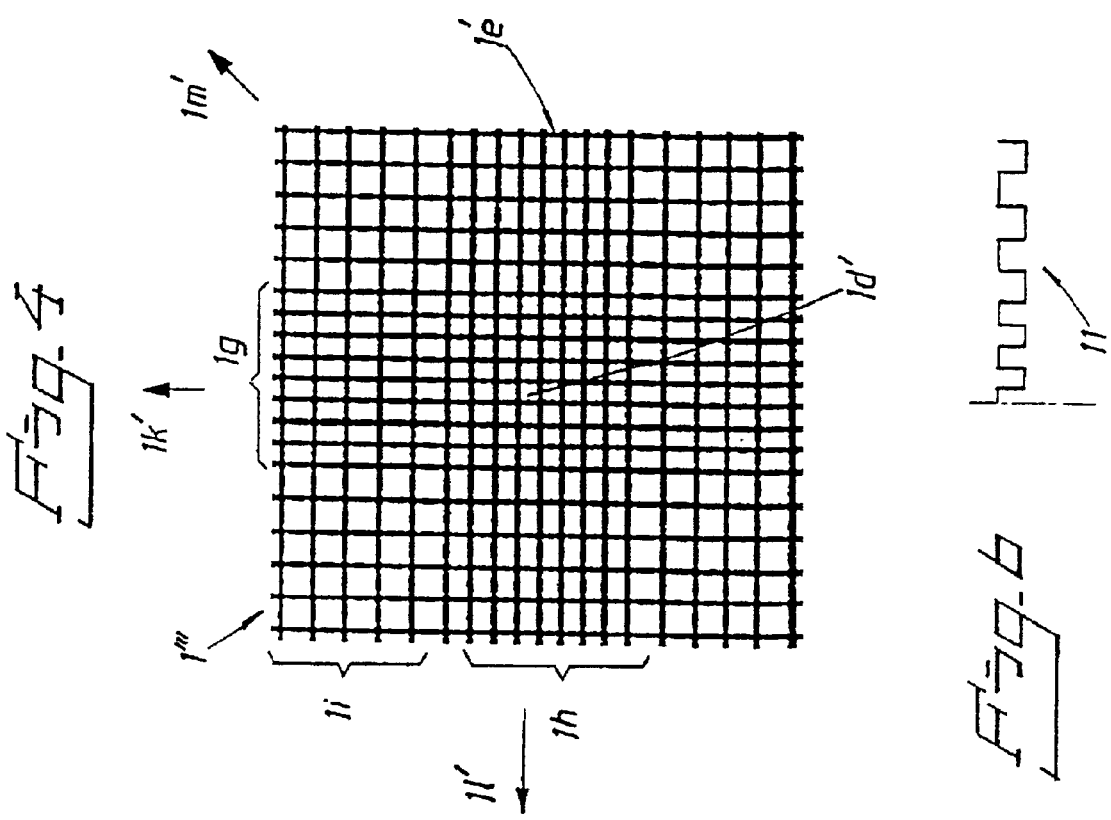
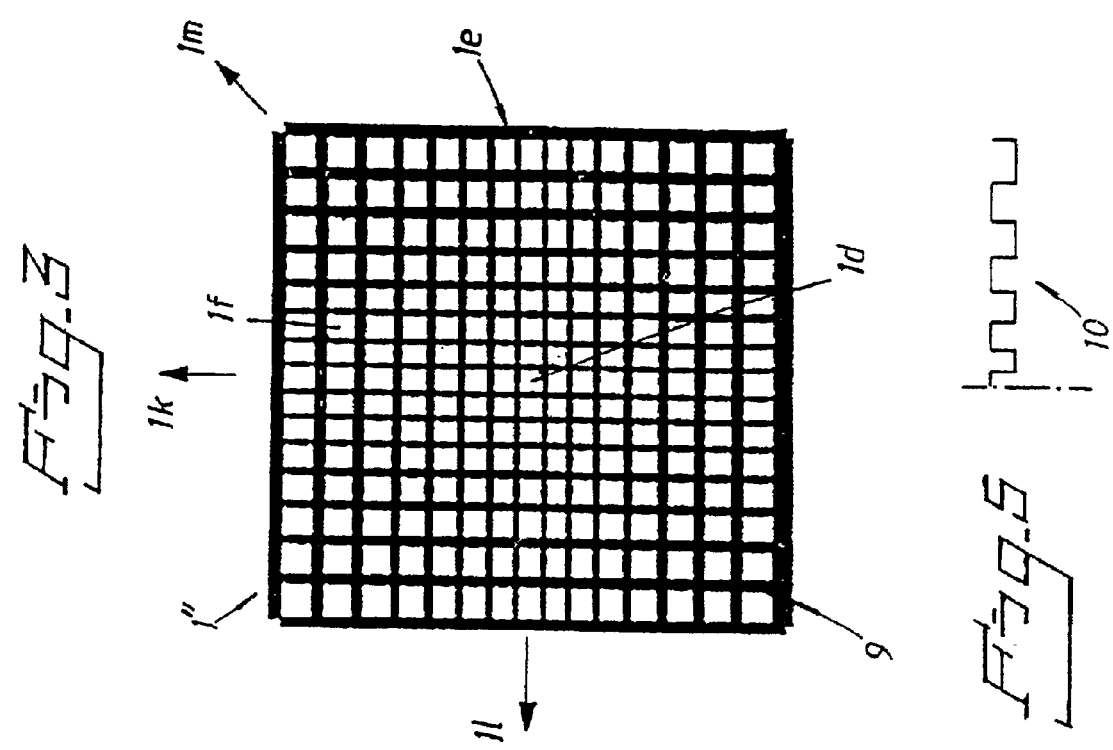

QUANTUM WELL BASED TWO-DIMENSIONAL DETECTOR FOR IR RADIATION AND CAMERA SYSTEM WITH SUCH A DETECTOR

This invention concerns a quantum well based two-dimensional detector for detecting infrared radiation which receives infrared radiation falling upon its detector surface at various angles of incidence within a range of 0–30° in relation to the normal to the surface. The detector comprises a grating arrangement for diffraction of the incident radiation. The invention also concerns a camera system for infrared radiation and comprising optics with an aperture and cooling unit and a quantum well based two-dimensional detector which receives via the aperture infrared radiation falling at various angles of incidence within a range of 0–30° in relation to the normal to the detector surface. The detector comprises in addition a grating arrangement for diffraction of the incident radiation.

The use of diffraction gratings of various kinds is already known for the purpose of increasing the sensitivity of a quantum well based detector for detecting infrared radiation, a so-called QWIP detector (Quantum Well Infrared Photodetector). Reference can be made to the Swedish patent 9101034 and the U.S. Pat. Nos. 5,075,749 and 5,506,419. QWIP detectors are completely insensitive to radiation which falls perpendicular to the surface, but by the introduction of a grating the direction of the incident radiation can be changed so that this can be absorbed by the detector structure. The grating is normally arranged so that the detector is most sensitive to radiation falling perpendicular to the detector surface.

The use of such detectors in IR camera systems is already known, where the detectors are combined with optics and cooling devices. An important component in this respect is the so-called cold aperture which is usually integrated with the detector in a vacuum flask (Dewar vessel). The cold aperture limits the angles of incidence of the radiation which falls on the detector.

A QWIP detector which is equipped with a through-put grating as above is usually sensitive within a relatively narrow range of angles. In particular this applies when a grating arrangement is used in accordance with the above-mentioned Swedish patent, where the grating constant or grating interval is selected so that the angles of diffraction are almost 90°. It only requires a very small change in the angle of incidence for the angle of diffraction to exceed 90° in relation to the normal to the detector surface whereupon the diffracted ray in question is lost as an active component in the detection, which results in a sudden reduction in the through-put efficiency.

In order for radiation to be detected by the detector it is necessary for the angles of incidence to lie within a range of angles where the detector is sensitive. For points which lie straight in front of the detector, that is straight in front of the cold aperture, all these rays will lie within a range of angles around 0°, which means that most of the radiation can be detected. On the other hand for points at the edge of the detector surface the rays fall principally at oblique angles, where previously known detectors have poor sensitivity. This is shown in FIGS. 1 and 2 where A shows the radiation falling on the centre of the detector surface via the cold aperture and B shows the radiation falling on the outer edges of the detector surface via the cold aperture. There is a need to be able to obtain even sensitivity over the whole detector surface in order to be able to achieve a better picture quality. This invention aims to solve this problem, among others.

In connection with the camera system there is also the requirement to be able to make the optics smaller and reduce the cooling requirement in the system. The invention also intends to solve this problem.

A detector according to the invention can principally be characterized in that the grating arrangement is selected with a grating interval which varies or changes from the central part of the detector or the detector surface out towards the outer parts or circumference of the detector or detector surface. It is further characterized in that the variation or change in the grating interval is arranged to retain or contribute towards retaining in the detection diffracted rays of the orders of 1 and −1 as active components over the whole detector surface by changing the angle value of the diffracted rays depending upon the angles of incidence of the radiation falling upon the various parts of the detector surface.

In the embodiments of the invention concept it is proposed that the grating interval varies linearly or in steps. Elements included in the grating arrangement vary in the horizontal cross-section of the grating arrangement in configuration size and/or shape and are, for example, square in the central part of the detector surface and change to a rectangular form in the part of the grating arrangement towards the outer parts or around the circumference of the detector surface. Further embodiments of the invention concept are described in the following patent claims regarding the construction of the detector.

A camera system according to the invention can principally be characterized in that, as described above, the grating arrangement is selected with a grating interval which varies or changes from the central part of the detector out towards the outer parts of the detector and that the grating interval or the change is selected to diffract rays which pass through the edge of the aperture, that is rays with the largest angle of incidence, by a value up to or exactly equal to 90° in relation to the normal to the detector surface. Other rays which pass through the aperture are diffracted by smaller angles than the abovementioned value, but are still close to 90°. The abovementioned values are selected preferably within the range approximately 85°–90°.

By means of the invention described above a more even and more stable sensitivity is obtained over the whole detector surface which, as described above, gives a better picture quality. In connection with the new camera system this can be further refined in relation to the current technology.

DESCRIPTION OF THE FIGURES

In the following a currently proposed embodiment of a detector and a camera system according to the invention will be described with reference to the attached figures, where FIG. 3 shows in horizontal view from underneath and in principle a first embodiment of a detector with the new grating arrangement, not to scale, FIG. 4 shows in horizontal view from underneath and in principle a second embodiment of the detector's grating arrangement, not to scale, FIG. 5 shows in diagrammatic form the linearly increasing grating interval from the centre of the detector surface out towards one outer edge of the detector surface, FIG. 6 shows in diagrammatic form the grating interval increasing or changing in steps from-m the centre of the detector surface out towards one outer edge of the detector.

FIGS. 1 and 2 refer principally to the problems which are associated with already known detectors and camera systems. FIG. 1 shows a radiation area A for the incident infrared radiation which falls on the detector 1 at the central parts 1b of its detector surface 1a. Detector 1 can be of a known type and in this connection reference is made to the Swedish and American patents mentioned in the introduction which concern the construction of a so-called QWIP detector. A so-called cold aperture is indicated by 2. The centrally incident radiation is shown by arrows and lines 3 and 4. The detector is principally sensitive within an area which is represented by the angle α. From the figure it can be seen that the area of sensitivity (the cone) covers the whole of the opening of the aperture 2a. The incident radiation 3, 4 falls within the area of sensitivity 5, 6 of the detector over all its extent, which indicates that the detector has a high degree of sensitivity for the incident radiation.

FIG. 2 shows that the area of sensitivity α' of the detector 1' at the outer edge 1c of the detector surface 1a' is only partially accessible to infrared radiation falling at oblique angles, which area is indicated by β. Only a small part can therefore be detected by the detector, which gives a lower degree of sensitivity for the reception by the detector of the incident oblique radiation. The area of sensitivity of the detector only covers a part of the incident radiation 3', 4'. See also the broken lines 5', 6' in FIG. 2 which show that the area of sensitivity only partially covers the opening 2a' in the aperture 2'. FIG. 2 also shows the construction of an IR camera K based on the QWIP detector 1'. The camera comprises an optics part O and a cooling unit KE. The abovementioned components are already known and are incorporated in the camera body KS in a known way. In FIG. 2 the diameter of the aperture is indicated by D and the distance between the aperture and the upper surface 1a' of the detector is indicated by S.

In accordance with the invention the grating structure is to be changed according to the angle of incidence of the incident radiation. This means preferably that the grating interval is longer at the edge of the detector than in the centre. The grating is preferably two-dimensional in order to be insensitive to polarization of the radiation. FIG. 3 shows a grating arrangement viewed from the underside of the detector in question. The detector is indicated in the diagram by 1". The grating element in the embodiment is constructed with quadrilateral configurations. At the central parts 1d of the grating arrangement or of the detector the grating elements are essentially square while at the outer edge 1e of the detector they are essentially rectangular. A grating element is indicated by 1f in FIG. 3. The figure is not drawn to scale, but is only an outline diagram.

Figure 1:
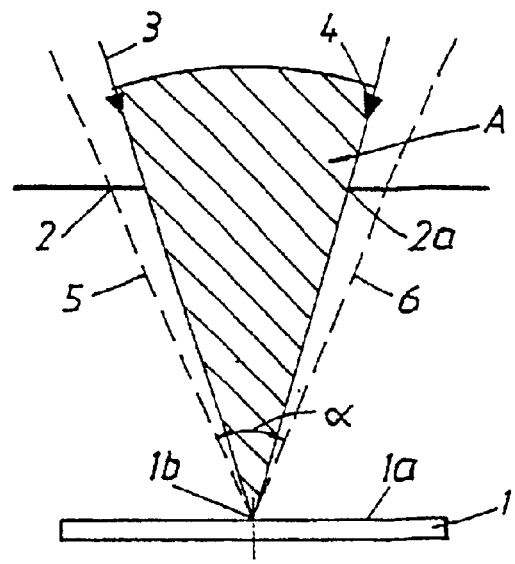
FIG. 1 shows in principal diagram form and from the side IR radiation falling through an aperture onto the centre of the detector surface in accordance with already known technology.

In accordance with a first embodiment of the invention concept the grating interval varies linearly from the centre 1d of the detector out towards the outer edge 1e of the detector.

The abovementioned variation or change in the grating interval can according to FIG. 4 be arranged in steps increasing out from the central part 1d' of the detector to the outer edge 1e' of the detector. In the embodiment according to FIG. 4 the increase in steps in the grating arrangement is arranged using strip-shaped formations 1g and 1h which in principle cross each other at the central part 1d' of the detector. In this way a first density in the grating arrangement is obtained in the area which is covered by both strips 1g and 1h. In parts which are individually covered by the strip-shaped arrangements 1g and 1h a second density is obtained in the grating arrangement. In the corners of the grating arrangement which are symbolized by 1i a third density is obtained for the grating arrangement. The corners 1i are not crossed by the strip-shaped structures 1g and 1h. The grating interval is smaller at the central parts and increases out towards the outer parts.

The grating arrangement can extend from the central parts of the detector surface out towards the outer edges of the detector surface with grating intervals or steps increasing in principle in all directions which are indicated by 1k, 1l, 1m and 1k', 1l', 1m' respectively in FIG. 1.

FIG. 5 is intended to show the linearly increasing grating interval in the grating arrangement from the central part 1d of the detector 1" out towards its straight outer edge 1e. In a corresponding way FIG. 6 is intended to show the grating interval increasing in steps from the centre 1d' of the detector 1'" out towards the outer edge 1e' in FIG. 4.

Figure 7:
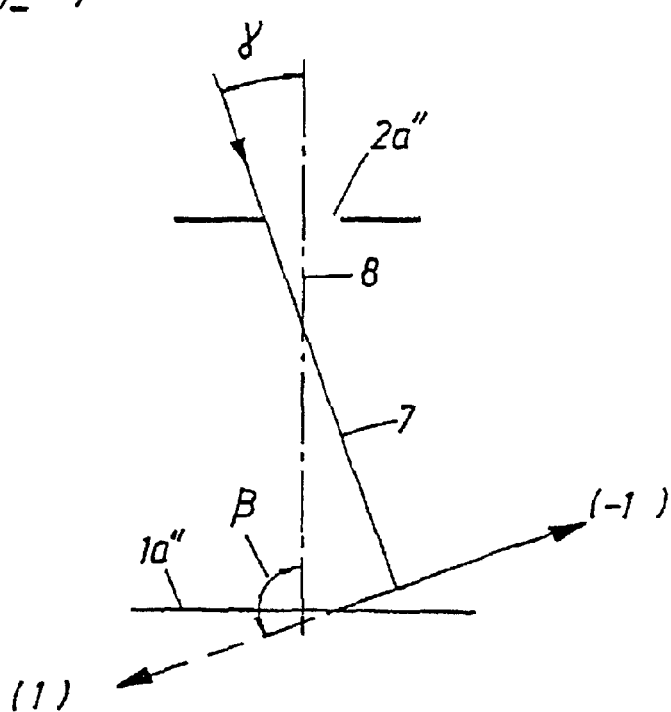
FIG. 7 shows in principal diagram form the case when diffracted rays are lost as active components in reproduction in detectors of known types.

FIG. 7 is intended to show the situation with already known technology. In this case the aperture is indicated by 2a" and the incident ray with the largest angle to the upper surface 1a" of the detector is indicated by 7. FIG. 7 is intended to show that diffracted rays of the order 1 have been given an angle β in relation to the normal 8 to the surface, which angle is greater than 90°. This means that the rays in question are lost as active components in the detection or recording. In FIG. 7 an angle (gamma) is indicated between the incident radiation and the normal 8 to the surface. This maximum angle is preferably selected within the range 0–45°.

Figure 8:
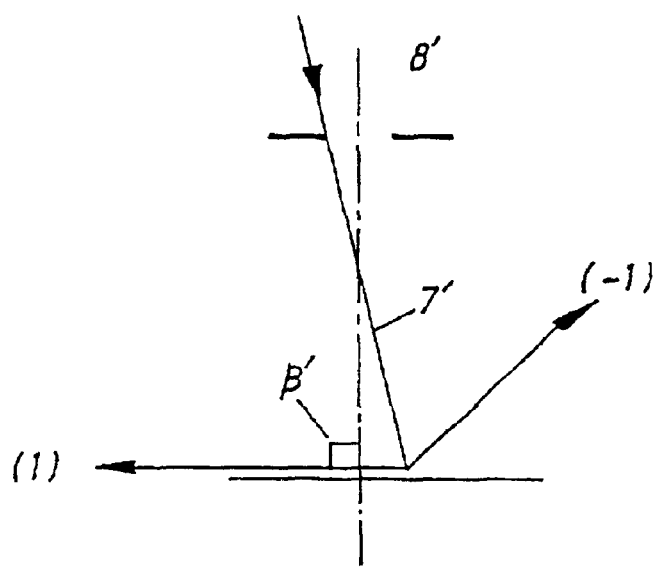
FIG. 8 shows in principal diagram form the diffraction of the infrared radiation falling on the detector surface at an angle via the aperture in accordance with the invention where the rays falling on the first edge of the detector surface are reproduced.

FIG. 8 shows the improvement according to the invention. The incident radiation 7' which corresponds to the incident radiation 7 in FIG. 7 is diffracted with diffraction rays of the orders 1 and −1 according to the figure. By the suitable selection of the grating interval the diffraction rays of the order 1 assume a value β' in relation to the normal 8' to the surface which is 90° or very near 90°, which means that the rays in question can be retained as active components, which means that the sensitivity of the detector is increased.

Figure 2:
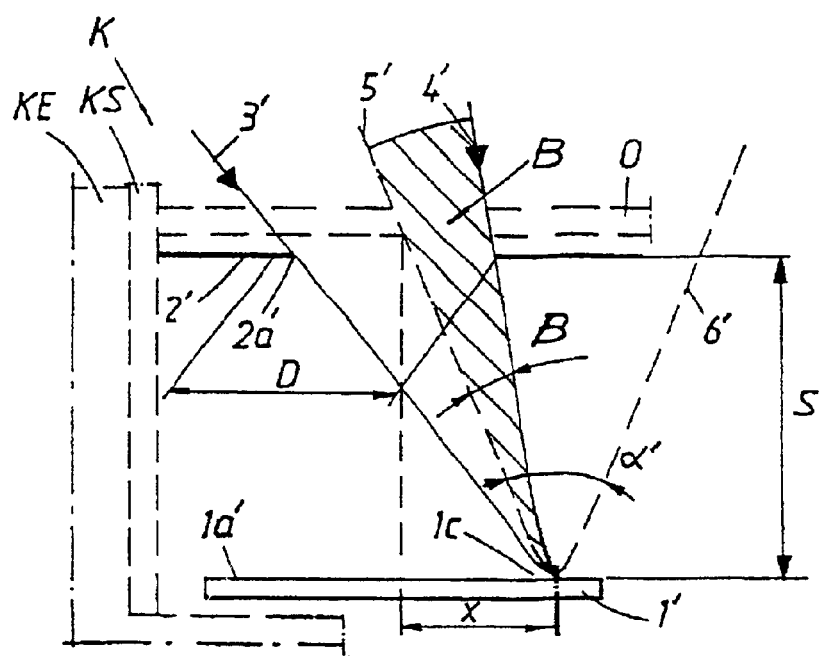
FIG. 2 shows in principal diagram form and from the side radiation falling through an aperture onto the outer edge of the detector related to the sensitivity area of the detector, where the figure shows the case for known technology.

In a preferred embodiment the variation of the grating interval is selected over the detector surface in accordance with the following. The starting point is a given aperture diameter D (see FIG. 2) at the distance S (see FIG. 2) from the surface 1a ' of the detector. A grating interval d(x) for a point at the distance x (see FIG. 2) from the centre 1d of the detector (see FIG. 3) is selected in such a way that the ray which has the largest angle of incidence is diffracted by precisely 90° in relation to the normal. This ray passes precisely at the edge of the aperture. All other rays which pass through have a smaller angle of incidence and are therefore diffracted by angles less than but close to 90° (see above). Expressed mathematically the grating interval is:

$$d(x) = \frac{\lambda}{n - \sin\alpha_{0\max}(x)}$$

where λ is the wavelength, n is the diffraction index of the grating substrate and $\alpha_{0max}$ (x) is the maximum angle of incidence and is given by the formula:

$$\tan\alpha_{0\max}(x) = \frac{x + D/2}{S}$$

In a second preferred embodiment the grating interval is selected according to a simplified method derived from the method above, by approximation of sin $\alpha_{0max}$ and tan $\alpha_{0max}$ by $\alpha_{0max}$. The grating interval is then given by $$d(x) = \frac{\lambda}{n}\left(1 + \frac{D}{2nS} + \frac{x}{nS}\right)$$

that is the grating interval varies linearly from the centre out towards the edges.

In an embodiment the following values are selected: λ=9 μm, D =7 mm and S=14 mm. For the substrate or the material GaAs n=3.28. At the centre of the detector d=2.95. At the edge, for example 8 mm from the centre, d=3.43 μm. In an embodiment d is selected at the centre of the detector within a range 2.5–3.0 μm and at the outer edge of the detector within a range 3.0–3.5 μm, where the higher values are related to each other within both areas, as are the lower values.

Selection of the grating interval d for the value of β' equal to or close to 90° is obtained by means of $$\frac{\sin\alpha o}{n} + \sin\beta m = \frac{m\lambda}{nd}$$

The abovementioned grating arrangement has been given the designation 9 in FIG. 3 and a graph for the periodicity according to FIG. 3 has been given the designation 10 in FIG. 5, while the graph for the periodicity according to FIG. 4 has been given the designation 11 in FIG. 6.

This invention is not restricted to the embodiments described above, but can be modified within the framework of the following patent claims and invention concept.

What is claimed is:

1. A quantum well based two-dimensional detector operative to detect incident infrared radiation falling upon a detector surface at various angles of incidence within a range of 0—45° in relation to a normal to the surface, the detector comprising:

a diffraction grating operative to diffract the incident radiation, the diffraction grating having a grating interval that varies from a central part of the detector out towards outer parts of the detector, such that the grating interval increases with increasing distance from the central part of the detector, wherein a variation in the grating interval at least contributes to retain in the detection diffracted rays of the orders 1 and −1 as active components across the detector surface by changing angle values of the diffracted rays depending upon angles of incidence of the radiation falling on the various parts of the detector surface.

2. The detector according to claim 1, wherein the grating interval varies linearly.

3. The detector according to claim 1, wherein the grating interval varies in steps.

4. The detector according to claim 1, wherein grating elements incorporated in the diffraction grating vary at least one of the configuration, size, or shape in a horizontal section of the diffraction grating.

5. The diffraction grating according to claim 4, wherein the grating elements are square at the central part of the detector surface and change to rectangular shapes toward the outer parts of the detector surface.

6. The detector according to claim 1, wherein a the grating interval is selected such that a sensitivity of the detector is substantially similar over an entire surface of the detector.

7. The detector according to claim 1, wherein the grating interval varies according to the formula:

$$d(x) = \frac{\lambda}{n - \sin\alpha_{0\max}(x)}$$

where λ is the wavelength, n is the diffraction index of the grating substrate and $\alpha_{0max}(x)$ is the maximum angle of incidence and is given by the formula:

$$\tan\alpha_{0\max}(x) = \frac{x + D/2}{S}$$

where x is a distance from a center of the detector, D is a diameter of an aperture and S is a distance between the aperture and an upper surface of the detector.

8. The detector according to claim 1, wherein the grating interval is selected by approximation of sin $\alpha_{0max}(x)$ and tan $\alpha_{0max}(x)$ by $\alpha_{0max}$ where the grating interval is given by $$d(x) = \frac{\lambda}{n}\left(1 + \frac{D}{2nS} + \frac{x}{nS}\right)$$

where λ is the wavelength, n is the diffraction index of the grating substrate, x is a distance from a center of the detector, D is a diameter of an aperture and S is a distance between the aperture and an upper surface of the detector.

9. The detector according to claim 1, wherein the grating interval varies linearly from the center out towards the edges.

10. The detector according to claim 1, wherein the grating interval has values of approximately 2.5–3.0 micrometers at the central part of the detector and approximately 3.0–3.5 micrometers at the outer parts of the detector.

11. A camera system for infrared radiation and comprising:

optics for focusing the infrared radiation;

an aperture for admitting the infrared radiation;

a cooling unit operative to cool the camera system; and a quantum well based two-dimensional detector operative to receive the infrared radiation via the aperture, the detector comprising a grating arrangement for diffraction of infrared radiation incident on the detector, the grating arrangement comprising a grating interval that varies from a central part of the detector out towards outer parts of the detector, such that the grating interval increases with increasing distance from the central part of the detector, wherein the grating interval is selected so as to diffract by 90° or less infrared radiation that passes through an edge of the aperture, and the grating interval is selected so as to diffract infrared radiation have an angle of incidence smaller the infrared radiation that passes through the edge of the aperture by values less the infrared radiation that passes through the edge of the aperture.

12. The camera system according to claim 11, wherein the infrared radiation has an angle of incidence smaller the infrared radiation that passes through the edge of the aperture is diffracted by 85°–90°.

13. The camera system according to claim 11, wherein the infrared radiation falls on the detector at angles within a range of 0°–45° in relation to a normal to a surface of the detector.

* * * * *